US012567723B2

(12) United States Patent
Higuchi et al.

(10) Patent No.: US 12,567,723 B2
(45) Date of Patent: Mar. 3, 2026

(54) LIGHT-EMITTING DEVICE, OPTICAL DEVICE, AND INFORMATION PROCESSING DEVICE

(71) Applicant: FUJIFILM Business Innovation Corp., Tokyo (JP)

(72) Inventors: Takafumi Higuchi, Ebina (JP); Takeshi Minamiru, Ebina (JP); Satoshi Inada, Ebina (JP); Shigetoshi Nakamura, Ebina (JP); Kenichi Ono, Ebina (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 1100 days.

(21) Appl. No.: 17/565,641

(22) Filed: Dec. 30, 2021

(65) Prior Publication Data

US 2022/0123524 A1 Apr. 21, 2022

Related U.S. Application Data

(63) Continuation of application No. PCT/JP2019/048507, filed on Dec. 11, 2019.

(30) Foreign Application Priority Data

Aug. 8, 2019 (JP) .................................. 2019-146383

(51) Int. Cl.
*H01S 5/183* (2006.01)
*G01B 11/24* (2006.01)
(Continued)

(52) U.S. Cl.
CPC .......... *H01S 5/18388* (2013.01); *G01B 11/24* (2013.01); *G06T 7/521* (2017.01);
(Continued)

(58) Field of Classification Search
CPC ..... H01S 5/18388; H01S 5/423; G06T 7/521; G06T 2207/30201; G06V 20/64; G06V 40/172; G01B 11/24
See application file for complete search history.

(56) References Cited

U.S. PATENT DOCUMENTS

2009/0295902 A1* 12/2009 Sato ........................ H01S 5/423
                                                                    372/24
2013/0230070 A1 9/2013 Sato et al.
(Continued)

FOREIGN PATENT DOCUMENTS

CN      107884066 A      4/2018
JP      2007-109925 A    4/2007
(Continued)

OTHER PUBLICATIONS

Office Action issued May 16, 2023 by the Japanese Patent Office in counterpart Japanese Patent Application No. 2019-146383.
International Search Report (PCT/ISA/210) issued Mar. 10, 2020 by the International Searching Authority in counterpart International Application No. PCT/JP2019/048507.
(Continued)

*Primary Examiner* — Jamil Ahmed
(74) *Attorney, Agent, or Firm* — Sughrue Mion, PLLC

(57) ABSTRACT

A light-emitting device includes: a light source including plural light-emitting elements; a first optical member that is provided in a light-emitting path of the light source, the first optical member being configured to reduce intensity of light emitted from the light source and emit the light; and a second optical member that is provided on a light-emitting side of the first optical member and is configured to diffuse and irradiate light incident from the first optical member.

13 Claims, 11 Drawing Sheets

(51) Int. Cl.

| | |
|---|---|
| *G06T 7/521* | (2017.01) |
| *G06V 20/64* | (2022.01) |
| *G06V 40/16* | (2022.01) |
| *H01S 5/42* | (2006.01) |

(52) U.S. Cl.
CPC ............ *G06V 20/64* (2022.01); *G06V 40/172* (2022.01); *H01S 5/423* (2013.01); *G06T 2207/30201* (2013.01)

(56) References Cited

U.S. PATENT DOCUMENTS

| | | | |
|---|---|---|---|
| 2014/0240469 A1 | 8/2014 | Lee | |
| 2018/0129866 A1* | 5/2018 | Hicks | H04N 23/20 |
| 2018/0259836 A1* | 9/2018 | Fukui | G01S 7/4814 |
| 2019/0335073 A1 | 10/2019 | Yamashita et al. | |

FOREIGN PATENT DOCUMENTS

| | | | |
|---|---|---|---|
| JP | 2008-78612 A | 4/2008 |
| JP | 2015-146396 A | 8/2015 |
| JP | 2018-54769 A | 4/2018 |
| JP | 2018-146525 A | 9/2018 |

OTHER PUBLICATIONS

Written Opinion (PCT/ISA/237) issued Mar. 10, 2020 by the International Searching Authority in counterpart International Application No. PCT/JP2019/048507.

International Preliminary Report on Patentability issued Feb. 8, 2022 in International Application No. PCT/JP2019/048507 (PCT/IB/373).

Written Opinion dated Mar. 10, 2020, issued by the International Searching Authority in counterpart International Application No. PCT/JP2019/048507 (PCT/ISA/237).

* cited by examiner

I (DETECTION RANGE)

310

A ——— A

II (SKIRT RANGE)

Z ⊗ ——➤ X y

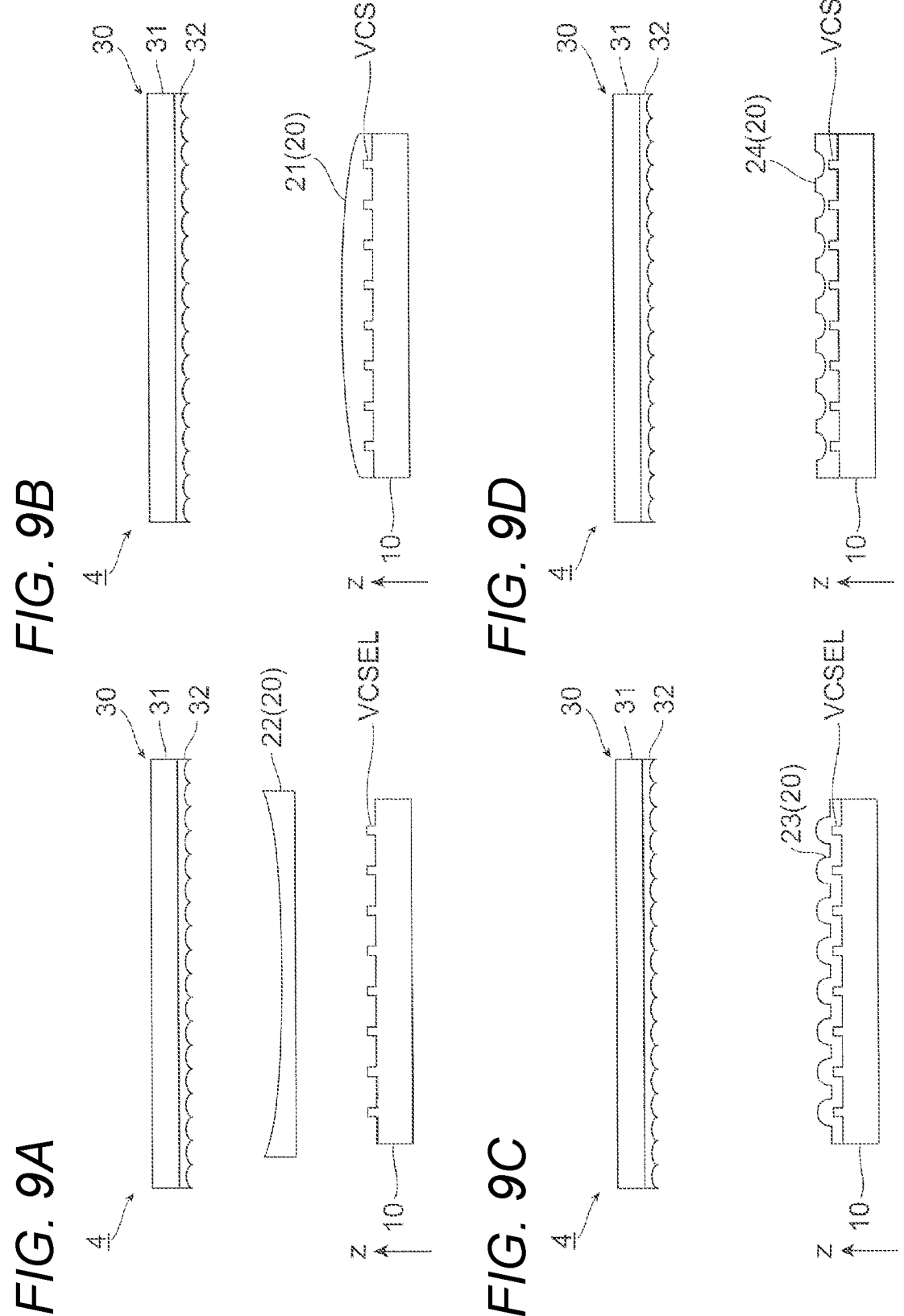

LIGHT-EMITTING DEVICE, OPTICAL DEVICE, AND INFORMATION PROCESSING DEVICE

CROSS-REFERENCE TO RELATED APPLICATIONS

This is a continuation of International Application No. PCT/JP2019/048507 filed on Dec. 11, 2019, and claims priority under 35 USC 119 from Japanese Patent Application No. 2019-146383 filed on Aug. 8, 2019.

BACKGROUND

Technical Field

The present invention relates to a light-emitting device, an optical device, and an information processing device.

Related Art

JP-A-2018-54769 describes an imaging device including: a light source; a diffusion plate that includes plural lenses arranged adjacent to each other on a predetermined plane and diffuses light emitted from the light source; and an imaging element that receives reflected light obtained by reflecting the light diffused by the diffusion plate by a subject. The plural lenses are arranged such that a period of interference fringes in the diffused light is three pixels or less.

SUMMARY

When a three-dimensional shape is measured by a time-of-flight method, in order to emit light to a measurement target, it is required to diffuse light emitted from a light source and irradiate a predetermined range with a predetermined light intensity distribution. In particular, when the three-dimensional shape measurement of this method is used in a mobile terminal such as a portable information processing terminal, it is required to reduce leakage of light having light intensity exceeding a predetermined standard.

Aspects of non-limiting embodiments of the present disclosure relate to a light-emitting device, an optical device, and an information processing device from where leaking light satisfies a predetermined intensity standard even if a failure occurs.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light-emitting device including: a light source including plural light-emitting elements; a first optical member that is provided in a light-emitting path of the light source, the first optical member being configured to reduce intensity of light emitted from the light source and emit the light; and a second optical member that is provided on a light-emitting side of the first optical member and is configured to diffuse and irradiate light incident from the first optical member.

BRIEF DESCRIPTION OF DRAWINGS

Exemplary embodiment(s) of the present invention will be described in detail based on the following figures, wherein:

FIG. 5A is a plan view, and FIG. 5B is a cross-sectional view taken along line VB-VB of FIG. 5A;

FIG. 7A illustrates a state where there is no light leakage, FIG. 7B illustrates a state where light leakage occurs due to breakage of a diffusion plate, and FIG. 7C illustrates a state where light leakage occurs due to breakage of a light intensity reduction member;

FIG. 8A illustrates a state where there is no light leakage, and FIG. 8B illustrates a state where light leakage occurs due to breakage of a diffusion plate;

FIGS. 9A to 9D illustrate a modification of the light-emitting device, FIG. 9A illustrates a case where the light intensity reduction member is a concave lens, FIG. 9B illustrates a case where a convex lens that is the light intensity reduction member is attached to the light source, FIG. 9C illustrates a case where the light intensity reduction member is a fly eye lens in which plural convex lenses are arranged, and FIG. 9D illustrates a case where the light intensity reduction member is a fly eye lens in which plural concave lenses are arranged;

FIG. 10A is a plan view, and FIG. 10B is a cross-sectional view taken along line XB-XB of FIG. 10A; FIG. 11A illustrates a state where there is no light leakage, and FIG. 11B illustrates a state where light leakage occurs due to breakage of a diffusion plate.

DETAILED DESCRIPTION

Hereinafter, exemplary embodiments of the present invention will be described in detail with reference to the accompanying drawings.

In many cases, an information processing device identifies whether a user who has accessed the information processing device is permitted to access the information processing device, and permits use of the information processing device, namely the own device, only when it is authenticated that the user is a user whose access is permitted. So far, methods of authenticating the user by a password, a fingerprint, an iris, or the like have been used. Recently, there is a demand for an authentication method having improved security. As this method, authentication is performed based on a three-dimensional image of a face of the user.

Here, an example in which the information processing device is a portable information processing terminal will be described, and the information processing device authenticates a user by recognizing a face that is captured as a three-dimensional image. The information processing device may also be applied to an information processing device such as a personal computer (PC), other than the portable information processing terminal.

A configuration, function, method, or the like described in the present exemplary embodiment may also be applied to acquisition of a three-dimensional image of an object in addition to the recognition of the face shape. That is, the configuration, function, method, or the like described in the present exemplary embodiment may also be applied to acquisition of a three-dimensional image in order to measure a three-dimensional shape of a measurement target (may be referred to as three-dimensional measurement) that is an object other than the face. In addition, a distance to the measurement target (hereinafter, referred to as a measurement distance) does not matter. In the present exemplary embodiment, the face or the object other than the face that is the target of the three-dimensional image acquisition may be referred to as an object to be irradiated or an object to be measured.

(Information Processing Device 1)

Figure 1:
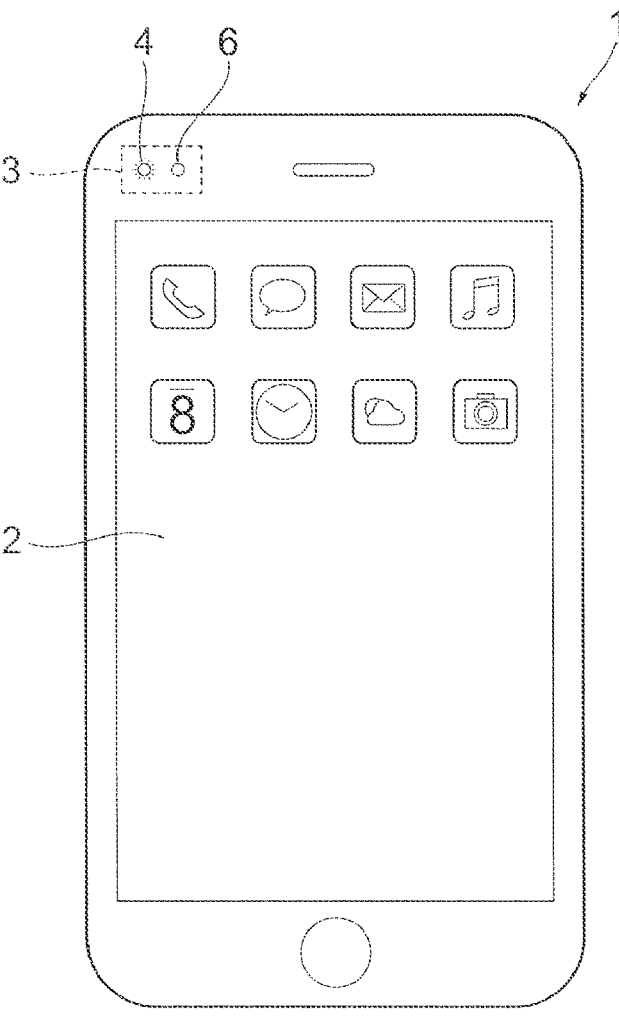
FIG. 1 illustrates an example of an information processing device to which an exemplary embodiment is applied.

FIG. 1 illustrates an example of an information processing device 1 to which the present exemplary embodiment is applied. As described above, the information processing device 1 is, for example, a portable information processing terminal.

The information processing device 1 includes a user interface unit (hereinafter, referred to as a UI unit) 2 and an optical device 3 that acquires a three-dimensional image. The UI unit 2 is formed by integrating, for example, a display device that displays information to a user and an input device to which an instruction relative to information processing is input by an operation of the user. The display device is, for example, a liquid crystal display or an organic EL display. The input device is, for example, a touch panel.

The optical device 3 includes a light-emitting device 4 and a three-dimensional sensor (hereinafter, referred to as a 3D sensor) 6. The light-emitting device 4 emits light toward a measurement target whose three-dimensional shape is to be measured in order to acquire a three-dimensional image, that is, a face in the example described here. The 3D sensor 6 acquires returning light that is emitted from the light-emitting device 4 and reflected by the measurement target, that is, the face in the example described here. The optical device 3 acquires the three-dimensional image of the face based on a so-called time-of-flight (TOF) method based on a flight time of light. In the following description, when the measurement target is the face, the face may be referred to as the measurement target. The 3D sensor 6 is an example of a light-receiving unit.

The information processing device 1 is configured as a computer including a CPU, a ROM, a RAM, and the like. The ROM includes a non-volatile rewritable memory such as a flash memory. Programs and constants stored in the ROM are loaded onto the RAM. When the CPU executes the programs loaded onto the RAM, the information processing device 1 is operated to execute various types of information processing.

(Three-Dimensional Shape Measurement Performed by Information Processing Device 1)

Figure 2:
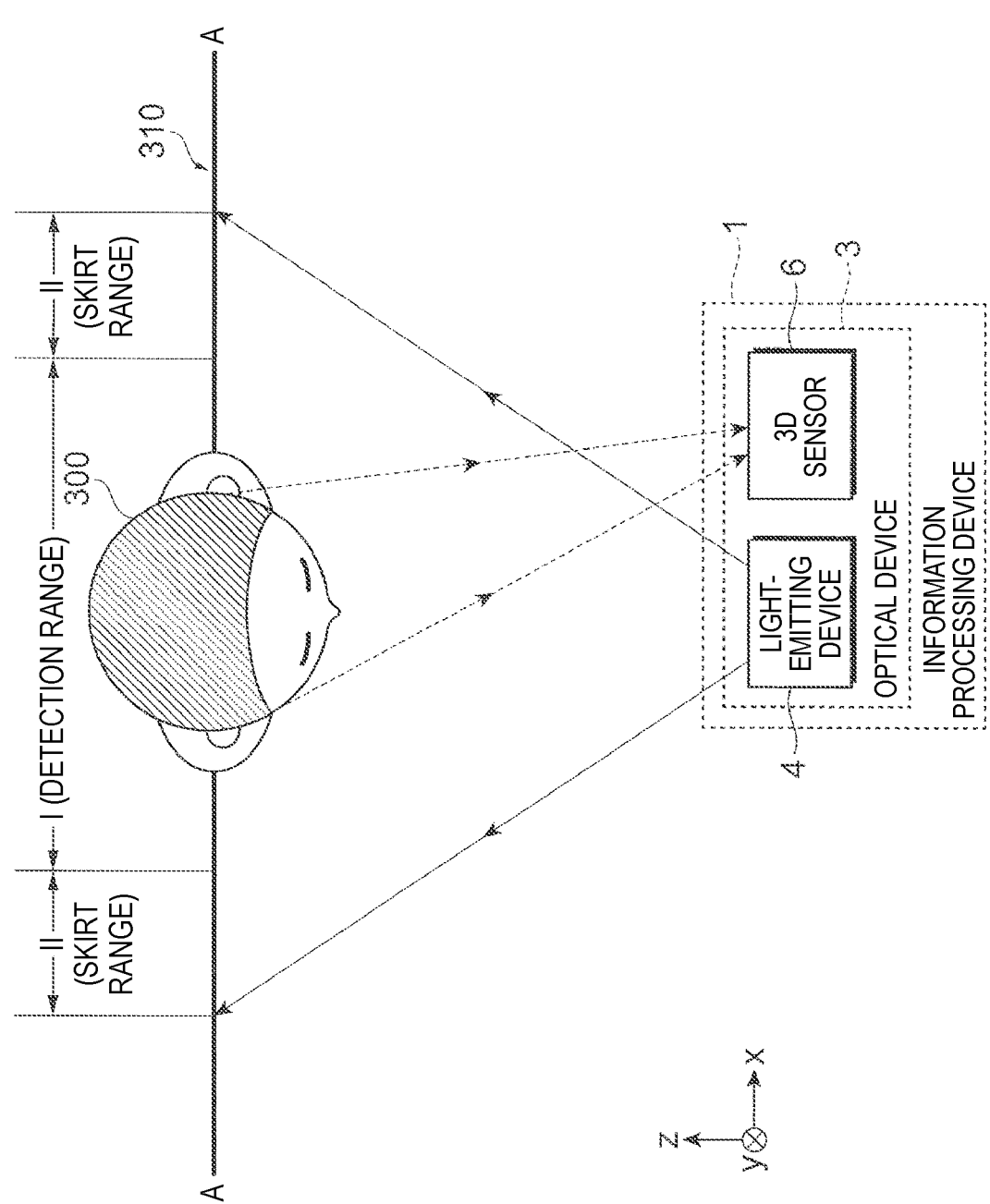
FIG. 2 illustrates three-dimensional shape measurement performed by the information processing device.

FIG. 2 illustrates three-dimensional shape measurement performed by the information processing device 1. A measurement target here is a face 300. As illustrated in FIG. 2, a right direction on paper is defined as an x direction, an upper direction is defined as a z direction, and a back side direction perpendicular to a plane of FIG. 2 is defined as a y direction. FIG. 2 is a diagram in which a head (face) is viewed from above the head.

In the optical device 3 of the information processing device 1, light is emitted from the light-emitting device 4 toward the face 300. Then, light reflected by the face 300 is received by the 3D sensor 6. That is, the optical device 3 is configured such that light is emitted from the light-emitting device 4 toward the measurement target and the reflected light from the measurement target is received by the 3D sensor 6. At this time, the light-emitting device 4 emits light toward an irradiated surface 310 that is a virtual surface provided to face the light-emitting device 4. Line A-A illustrated on the irradiated surface 310 traverses on the irradiated surface 310 illustrated in FIG. 3A, which will be described later, in the x direction.

A detection range I, in which the face 300 is detected and a three-dimensional shape of the face 300 is measured, and a skirt range II surrounding the detection range I are formed on the irradiated surface 310. The detection range I is a range irradiated with light having light intensity that enables the three-dimensional shape of the face 300 to be measured by reflected light when the face 300 is present in this region. Meanwhile, the skirt range II is a range in which light intensity decreases as a distance from the detection range I increases. Therefore, even when the face 300 is present in the skirt range II, the three-dimensional shape of the face 300 is not measured with high accuracy as compared with the case where the face 300 is present in the detection range I. That is, the skirt range II is a non-detection range that is not suitable for measuring the three-dimensional shape of the face 300. The detection range I and the skirt range II are ranges reached by the light from the light-emitting device 4. The detection range I is a predetermined range used for measuring the three-dimensional shape, and is a range irradiated with light with a predetermined light intensity distribution. Here, the light intensity refers to luminous intensity.

Figure 3:
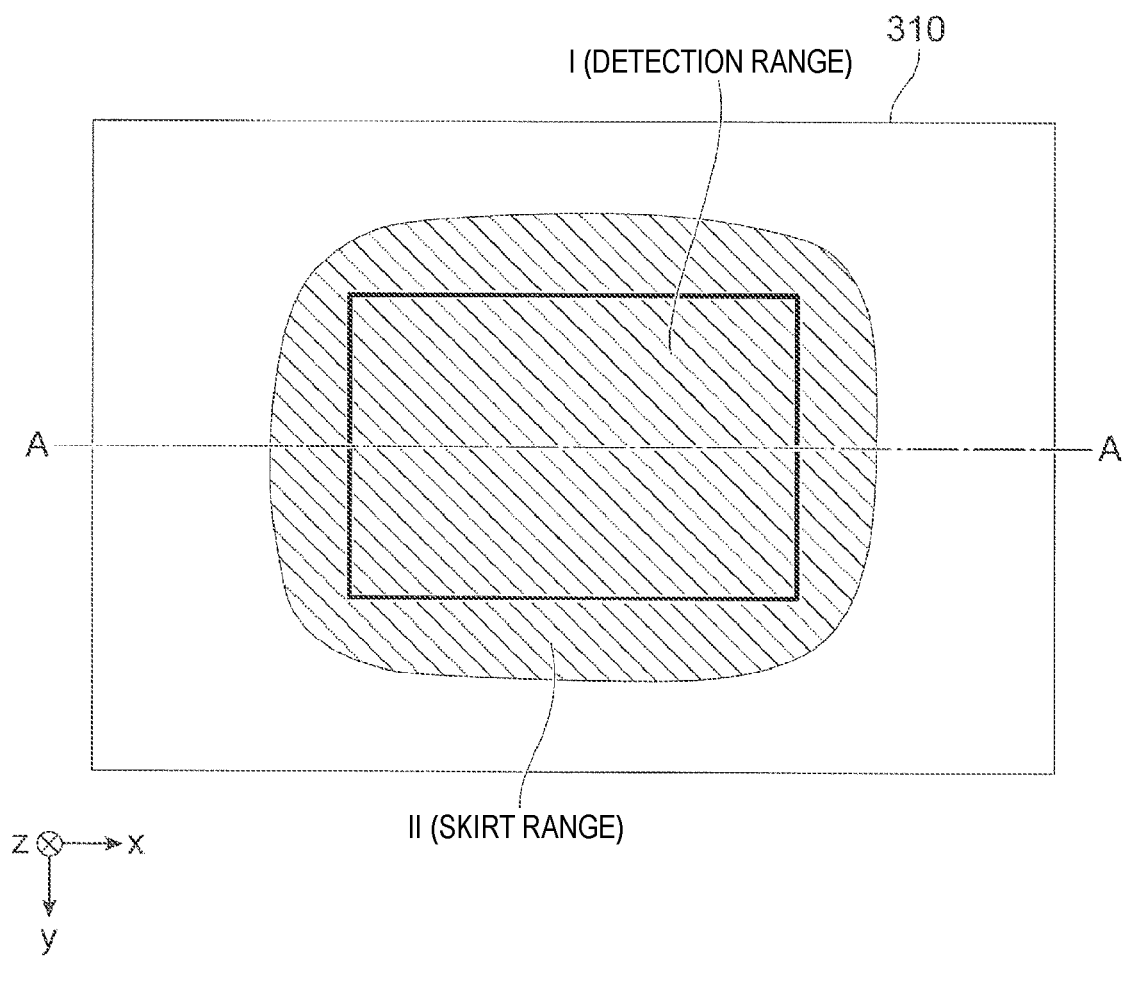
FIG. 3 illustrates an irradiation pattern on an irradiated surface.

FIG. 3 illustrates an irradiation pattern on the irradiated surface 310. As illustrated in FIG. 3, a right direction on paper is the x direction, a lower direction is the y direction, and a back side direction perpendicular to a plane of FIG. 3 is the z direction.

It is assumed that the irradiation pattern illustrated in FIG. 3 has a quadrangular shape whose longitudinal direction is oriented in the x direction and whose corners are rounded. In this irradiation pattern, a rectangular range surrounded by a solid line in a central portion is the detection range I, and a peripheral portion surrounding the detection range I is the skirt range II. The detection range I may be set to have a shape other than the rectangular shape. That is, the irradiation pattern refers to a range irradiated with light including the detection range I and the skirt range II.

Figure 4:
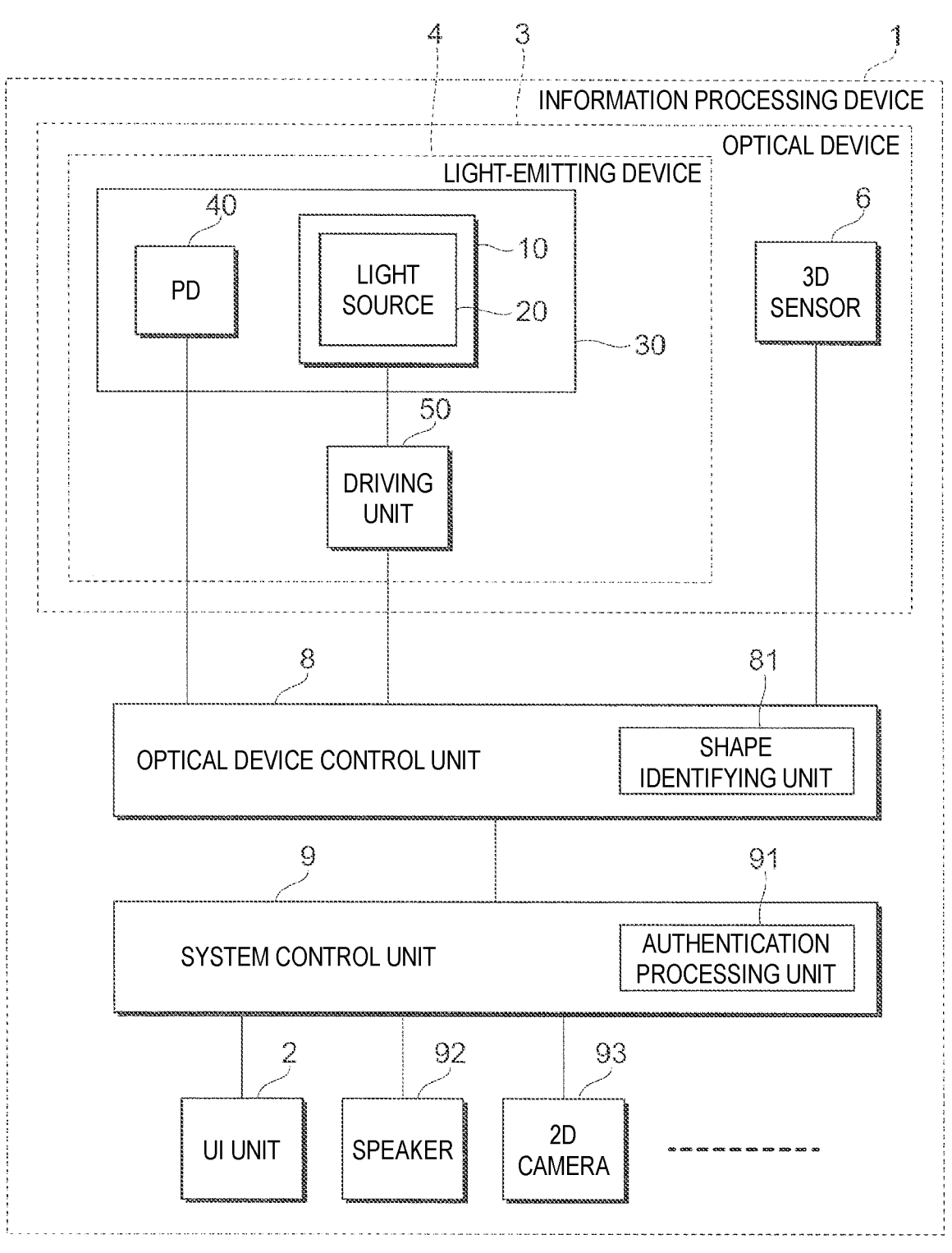
FIG. 4 is a block diagram illustrating a configuration of the information processing device.

FIG. 4 is a block diagram illustrating a configuration of the information processing device 1.

The information processing device 1 includes the optical device 3 described above, an optical device control unit 8, and a system control unit 9. As described above, the optical device 3 includes the light-emitting device 4 and the 3D sensor 6. The optical device control unit 8 controls the optical device 3. The optical device control unit 8 includes a shape identifying unit 81. The system control unit 9 controls the entire information processing device 1 as a system. The system control unit 9 includes an authentication processing unit 91. The UI unit 2, a speaker 92, and a two-dimensional camera (denoted as a 2D camera in FIG. 2) 93, and the like are connected to the system control unit 9. Hereinafter, the components described above will be described in order.

The light-emitting device 4 included in the optical device 3 includes a light source 10, a light intensity reduction member 20, a diffusion plate 30, a light-receiving element 40 (denoted as PD in FIG. 4) for monitoring light amount, and a driving unit 50. The light source 10 emits light in order to measure a three-dimensional shape of a detection target. The light intensity reduction member 20 is an optical member that reduces intensity (light intensity) of the light emitted from the light source 10. The diffusion plate 30 is an optical member that diffuses the light passing through the light intensity reduction member 20 and irradiates the irradiated surface 310 with the diffused light. The light source 10, the light intensity reduction member 20, the diffusion plate 30, and the light-receiving element 40 for monitoring light amount will be described in detail later. Here, the light intensity reduction member 20 is an example of a first optical member, and the diffusion plate 30 is an example of a second optical member.

The driving unit 50 in the light-emitting device 4 drives the light source 10. For example, the light source 10 is driven by the driving unit 50 so as to emit light that repeats at several tens of MHz to several hundreds of MHz in a pulsed manner. The light emitted by the light source 10 is referred to as emitted light, and pulsed light emitted from the light source 10 is referred to as emitted light pulse.

The 3D sensor 6 includes plural light-receiving regions arranged in a lattice pattern. The 3D sensor 6 receives pulsed light reflected from the measurement target in response to the emitted light pulse from the light source 10 of the light-emitting device 4. The light pulse received by the 3D sensor 6 is referred to as a received light pulse. Then, the 3D sensor 6 outputs, as a digital value for each light-receiving region, a signal corresponding to a time from when the light is emitted from the light source 10 to when the light is reflected by the measurement target and received by the 3D sensor 6. For example, the 3D sensor 6 is configured as a device having a CMOS structure in which each light-receiving region includes two gates and two charge accumulating units corresponding to the gates. The 3D sensor 6 is configured to alternately transfer photoelectrons generated in each light-receiving region to one of the two charge accumulating units by alternately applying pulses to the two gates, and to accumulate charges corresponding to a phase difference between the emitted light pulse and the received light pulse. Then, a digital value corresponding to the charges corresponding to the phase difference between the emitted light pulse and the received light pulse is output for each light-receiving region as a signal via an AD converter. The 3D sensor 6 may include a condensing lens.

The shape identifying unit 81 of the optical device control unit 8 acquires the digital value obtained for each light-receiving region of the 3D sensor 6 from the 3D sensor 6. Then, the shape identifying unit 81 measures the three-dimensional shape of the measurement target by calculating a distance to the measurement target for each light-receiving region based on the acquired digital value. The shape identifying unit 81 identifies a three-dimensional image from the measured three-dimensional shape.

The authentication processing unit 91 of the system control unit 9 performs an authentication process related to use of the information processing device 1 when the three-dimensional image of the measurement target, which is an identification result identified by the shape identifying unit 81, matches a three-dimensional image stored in advance in the ROM or the like. The authentication process related to the use of the information processing device 1 is, for example, a process of determining whether to permit the use of the information processing device 1, namely the own device. When the measurement target is a face, if a three-dimensional image of the face matches a three-dimensional image of a face stored in a storage member such as a ROM, the use of the information processing device 1, including various applications provided by the information processing device 1, is permitted.

The shape identifying unit 81 and the authentication processing unit 91 are constituted by a CPU that executes a program, for example. These functions may also be implemented by an integrated circuit such as an ASIC or an FPGA. Further, these functions may also be implemented by cooperation between a CPU that executes software such as a program and an integrated circuit.

Although the optical device 3, the optical device control unit 8, and the system control unit 9 are separately illustrated in FIG. 4, the system control unit 9 may include the optical device control unit 8. The optical device control unit 8 may be included in the optical device 3. Further, the optical device 3, the optical device control unit 8, and the system control unit 9 may be integrated.

(Configuration of Optical Device 3)

Next, the optical device 3 will be described in detail.

Figure 5A:
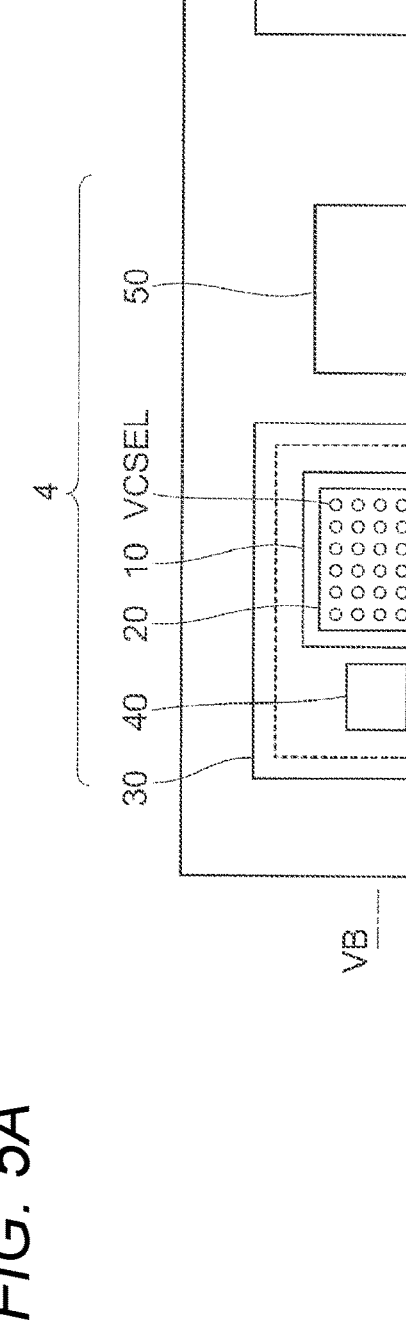
FIGS. 5A and 5B illustrate an example of a plan view and a cross-sectional view of an optical device to which a first exemplary embodiment is applied.
Figure 5B:
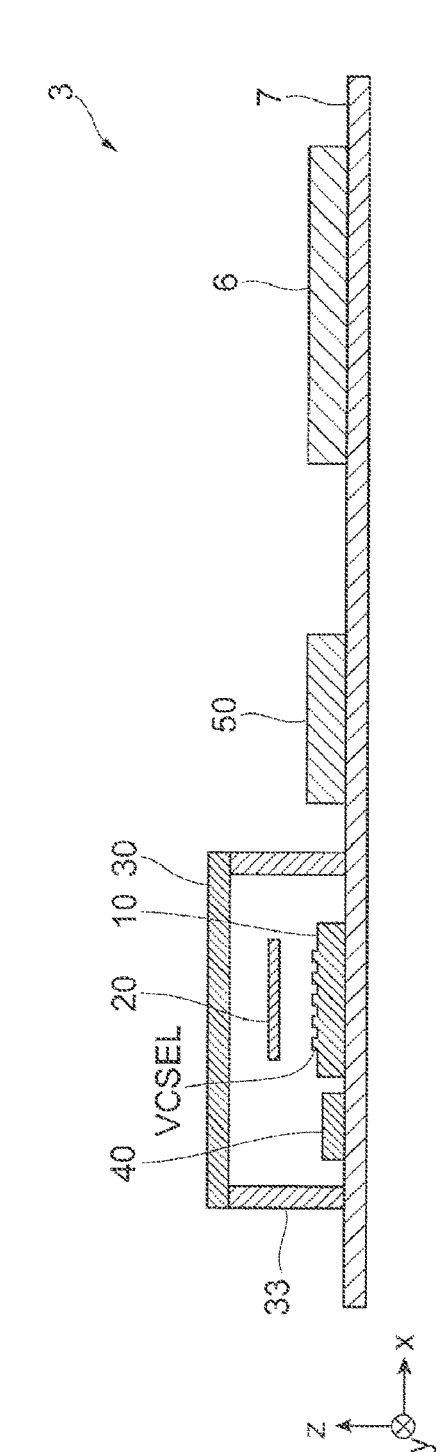

FIGS. 5A and 5B illustrate an example of a plan view and a cross-sectional view of the optical device 3 to which a first exemplary embodiment is applied. FIG. 5A is a plan view, and FIG. 5B is a cross-sectional view taken along line VB-VB of FIG. 5A. Here, in FIG.

5A, a horizontal direction on paper is the x direction, an upper direction on the paper is the y direction, and a front side direction perpendicular to a plane of FIG. 5A is the z direction.

First, the plan view illustrated in FIG. 5A will be described.

In the optical device 3, the light-emitting device 4 and the 3D sensor 6 are arranged side by side in the x direction on a circuit board 7, for example. The circuit board 7 uses, as a base member, a plate-shaped member made of an insulating material, and is provided with a conductor pattern made of a conductive material. The insulating material is, for example, ceramic, epoxy resin, or the like. The conductive material is, for example, a metal such as copper (Cu) or silver (Ag), or a conductive paste containing such metals. The circuit board 7 may be a single-layer board having a conductor pattern provided on a front surface thereof, or may be a multi-layer board having plural layers of conductor patterns. The light-emitting device 4 and the 3D sensor 6 may be disposed on different circuit boards.

In the light-emitting device 4, the light-receiving element 40 for monitoring light amount, the light source 10, and the driving unit 50 are arranged side by side in the x direction on the circuit board 7, for example. The light intensity reduction member 20 is provided so as to cover the light source 10, and the diffusion plate 30 is provided so as to further cover the light source 10 covered with the light intensity reduction member 20 and the light-receiving element 40 for monitoring light amount (see FIG. 5B).

A planar shape of the light source 10 is, for example, rectangular. A light-emitting direction (light-emitting side) of the light source 10 is the z direction. The light source 10 may be directly mounted on the circuit board 7, or may be mounted on the circuit board 7 via a heat dissipation base material such as aluminum oxide or aluminum nitride. When the heat dissipation base material is interposed, electric power supplied to the light source 10 may be increased, and thus light output of the light source 10 is increased. Hereinafter, the light source 10 will be described as being mounted directly on the circuit board 7. Here, the planar shape refers to a shape in a planar view, and the planar view refers to a view from the z direction in FIG. 5A. The same applies hereinafter. It should be noted that the planar shape of the light source 10 may not be rectangular. Here, the light output refers to a light flux.

The light source 10 includes a vertical-cavity surface-emitting laser (VCSEL) element. Hereinafter, the vertical-cavity surface-emitting laser element VCSEL is referred to as the VCSEL. As will be described later, in the VCSEL, an active region serving as a light-emitting region is provided between a lower multi-layer film reflector and an upper multi-layer film reflector that are stacked on a board, and a laser beam is emitted in a direction perpendicular to the board. For this reason, plural VCSELs are two-dimensionally arranged to easily constitute a surface-emitting light source. The light source 10 is formed by integrating the plural VCSELs as one semiconductor component. The VCSEL is an example of a light-emitting element.

The number of VCSELs constituting the light source 10 is, for example, 10 to 1000. The plural VCSELs constituting the light source 10 are connected in parallel and driven in parallel. That is, the plural VCSELs simultaneously emit light. The light source 10 is, for example, 0.5 mm square to 3 mm square. When irradiating a farther object to be irradiated, the number of VCSELs may be further increased.

As described above, the light source 10 emits the light in order to measure the three-dimensional shape of the measurement target. During the user authentication based on the shape of the face, a measurement distance is about 10 cm to about 1 m. Thus a length of one side of the detection range I is about 1 m. Since the light source 10 is required to irradiate the detection range I with light having predetermined light intensity, the VCSELs constituting the light source 10 are required to have large light output. In the light source 10 in which 500 VCSELs are integrated, for example, light output of one VCSEL may be 4 mW to 8 mW, and light output of the light source 10 may be 2 W to 4 W.

In FIG. 5A, the plural VCSELs in the light source 10 are arranged to be positioned at lattice points in a square shape, for example. The plural VCSELs may be arranged in another array such as an array in which positions at which the VCSELs are arranged for each row are shifted by a half pitch.

The light intensity reduction member 20 is an optical member that is light-transmissive so as to allow light emitted from each of the plural VCSELs included in the light source 10 (hereinafter, referred to as emitted light) to pass therethrough, and has a function of increasing a spread angle of the emitted light of each VCSEL. When light is emitted from an emission surface of each VCSEL, the light is emitted at a spread angle determined by a structure of the VCSEL. The light intensity reduction member 20 further increases the spread angle of the light emitted from the VCSEL and emits the light. Therefore, light intensity of the light passing through the light intensity reduction member 20 is reduced. Therefore, this optical member is referred to as the light intensity reduction member 20. The light intensity reduction member 20 may reduce the light intensity by a method other than the method of increasing the spread angle of the light emitted from the VCSEL.

The diffusion plate 30 is, for example, a member having a rectangular planar shape. The diffusion plate 30 diffuses and emits light incident on the diffusion plate 30. At this time, the diffusion plate 30 changes directivity of the light incident on the diffusion plate 30 from the light intensity reduction member 20 and emits the light. That is, the diffusion plate 30 emits the light so as to provide a light intensity distribution different from a light intensity distribution in a case where the light emitted from the light intensity reduction member 20 is emitted to the irradiated surface 310 without passing through the diffusion plate 30. For example, since the light source 10 has a small size as described above, the light source 10 may be regarded as a point light source. The diffusion plate 30 changes an irradiation pattern of the light incident via the light intensity reduction member 20 from the light source 10 to the irradiation pattern on the irradiated surface 310 as illustrated in FIG. 3. Since the diffusion plate 30 diffuses and emits the incident light, the diffusion plate 30 also reduces the light intensity.

A size of the diffusion plate 30 may be set such that, for example, a lateral width and a vertical width are 1 mm to 10 mm, and a thickness is 0.1 mm to 1 mm. The diffusion plate 30 may cover the light source 10 covered with the light intensity reduction member 20 and the light-receiving element 40 for monitoring light amount, in a plan view. Although an example in which the diffusion plate 30 has the rectangular shape in the plan view is described in FIG. 5A, the diffusion plate 30 may have another shape such as a polygonal shape or a circular shape. When the diffusion plate 30 has the size and the shape as described above, the diffusion plate 30 suitable for face authentication of the portable information processing terminal and three-dimensional shape measurement at a relatively short distance of about several meters is provided.

Next, the cross-sectional view illustrated in FIG. 5B will be described.

The light intensity reduction member 20 is held by a support member (not illustrated) on the z direction side, which is a light-emitting side of the VCSEL included in the light source 10. The light intensity reduction member 20 is held by the support member at a position separated by a predetermined distance from the emission surface of the VCSEL included in the light source 10. The diffusion plate 30 is supported by a side wall 33 on the z direction side, which is the light-emitting side of the light source 10. The side wall 33 is provided to surround the light intensity reduction member 20, which covers the light source 10, and the light-receiving element 40 for monitoring light amount. The diffusion plate 30 is held by the side wall 33 at a predetermined distance from each of the light intensity reduction member 20, which covers the light source 10, and the light-receiving element 40 for monitoring light amount. The light incident on the diffusion plate 30 from the light source 10 via the light intensity reduction member 20 is emitted from the diffusion plate 30 onto the irradiated surface 310 (see FIG. 2).

When the side wall 33 is formed of a member that absorbs the light emitted from the light source 10, the light emitted from the light source 10 is prevented from passing through the side wall 33 and being radiated to the outside. Since the light source 10, the light intensity reduction member 20 and the light-receiving element 40 for monitoring light amount are sealed by the diffusion plate 30 and the side wall 33, dust prevention, moisture prevention, and the like are achieved. In the first exemplary embodiment, by arranging the light source 10 with the light intensity reduction member 20 and the light-receiving element 40 for monitoring light amount close to each other, the light source 10 and the light-receiving element 40 for monitoring light amount may be easily surrounded by the side wall 33 that has a small size, and thus the diffusion plate 30 is sufficient with a small size.

The light-receiving element 40 for monitoring light amount is a device that outputs an electric signal corresponding to an amount of received light (hereinafter, referred to as the received light amount). The light-receiving element 40 for monitoring light amount is, for example, a photodiode (PD) made of silicon or the like. The light-receiving element 40 for monitoring light amount is configured to receive light that is emitted from the light source 10 via the light intensity reduction member 20 and reflected by a back surface of the diffusion plate 30, that is, a surface on the −z direction side of the diffusion plate 30.

The light source 10 is controlled based on the received light amount of the light-receiving element 40 for monitoring light amount so as to maintain predetermined light output. That is, the optical device control unit 8 controls the light source 10 via the driving unit 50 based on the received light amount of the light-receiving element 40 for monitoring light amount. When the received light amount of the light-receiving element 40 for monitoring light amount is extremely low, the diffusion plate 30 may be detached or broken, and the light emitted from the light source 10 may be directly emitted to the outside without being diffused by the diffusion plate 30. In such a case, the optical device control unit 8 reduces the light output of the light source 10 via the driving unit 50. For example, the optical device control unit 8 stops emission of the light from the light source 10.

(Multiple Transverse Mode VCSEL Having λ Resonator Structure)

As an example of the VCSEL included in the light source 10 to which the first exemplary embodiment is applied, a multiple transverse mode VCSEL having a λ resonator structure will be described. The multiple transverse mode may be referred to as multi-mode. Hereinafter, the multiple transverse mode is referred to as the multi-mode.

Figure 6:
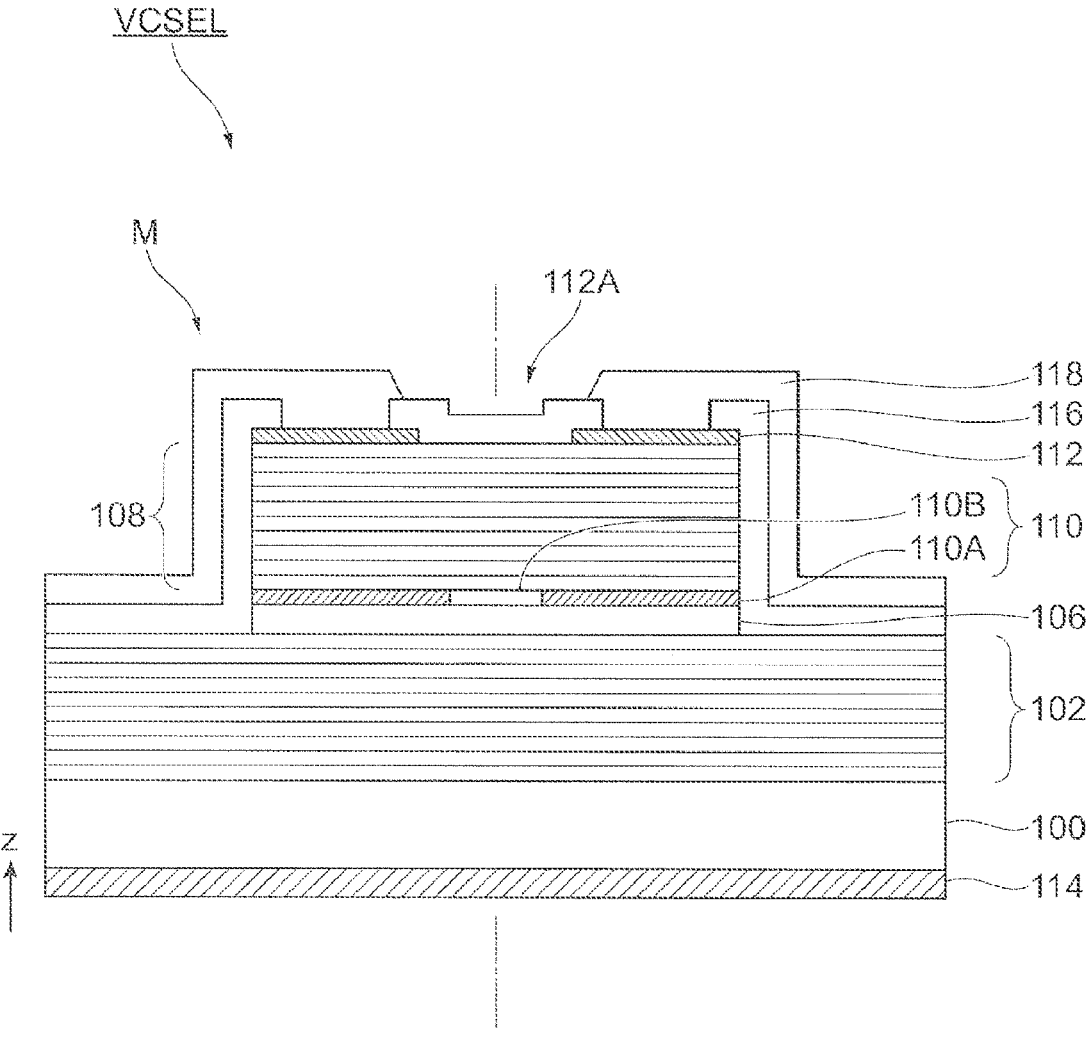
FIG. 6 illustrates a cross-sectional structure of a multi-mode VCSEL having a single λ, resonator structure constituting a light source.

FIG. 6 illustrates a cross-sectional structure of a multimode VCSEL having a single X, resonator structure that constitutes the light source 10. As illustrated in FIG. 6, an upper direction on paper is the z direction.

The VCSEL is formed by sequentially stacking, on a semiconductor board 100 such as an n-type GaAs semiconductor board, an n-type lower distributed Bragg reflector (DBR) 102 in which AlGaAs layers having different Al compositions are alternately stacked, an active region 106 including a quantum well layer interposed between an upper spacer layer and a lower spacer layer, and a p-type upper distributed Bragg reflector 108 in which AlGaAs layers having different Al compositions are alternately stacked. Hereinafter, a distributed Bragg reflector is referred to as a DBR.

The n-type lower DBR 102 is a laminate of pairs of an $Al_{0.9}Ga_{0.1}As$ layer and a GaAs layer, a thickness of each layer is $\lambda/4n_r$ ($\lambda$ is an oscillation wavelength, and nr is a refractive index of a medium), and these layers are alternately stacked in 40 cycles. A carrier concentration after doping with silicon, which is an n-type impurity, is, for example, $3\times1018$ $cm^{-3}$.

The active region 106 is formed by stacking the lower spacer layer, the quantum well active layer, and the upper spacer layer. For example, the lower spacer layer is an undoped $Al_{0.6}Ga_{0.4}As$ layer, the quantum well active layer is an undoped InGaAs quantum well layer and an undoped GaAs barrier layer, and the upper spacer layer is an undoped $Al_{0.6}Ga_{0.4}As$ layer.

The p-type upper DBR 108 is a laminate of pairs of a p-type $Al_{0.9}Ga_{0.1}As$ layer and a GaAs layer, a thickness of each layer is $\lambda/4n_r$, and these layers are alternately stacked in 29 cycles. A carrier concentration after doping with carbon, which is a p-type impurity, is, for example, $3\times10^{18}$ $cm^{-3}$. A contact layer made of p-type GaAs may be formed on an uppermost layer of the upper DBR 108, and a current confinement layer 110 made of p-type AlAs may be formed on a lowermost layer of the upper DBR 108 or inside the upper DBR 108.

By etching semiconductor layers stacked from the upper DBR 108 to the lower DBR 102, a cylindrical mesa M is formed on the semiconductor board 100. As a result, the current confinement layer 110 is exposed on a side surface of the mesa M. By an oxidation process, an oxidized region 110A oxidized from the side surface of the mesa M and a conductive region 110B surrounded by the oxidized region 110A are formed in the current confinement layer 110. In the oxidation process, an AlAs layer has a higher oxidation rate than an AlGaAs layer, and the oxidized region 110A is oxidized from the side surface toward an inner side of the mesa M at a substantially constant rate, so that a planar shape of the conductive region 110B is a shape that reflects an outer shape of the mesa M, that is, a circular shape, and a center of the shape substantially coincides with an axial direction of the mesa M indicated by a dashed-dotted line. The mesa M has a columnar structure. The semiconductor layers from the upper DBR 108 to the lower DBR 102 are stacked by epitaxy. Therefore, these semiconductor layers may be referred to as an epitaxial layer.

An annular p-side electrode 112 in which Ti, Au, or the like is stacked is formed on an uppermost layer of the mesa M. The p-side electrode 112 is in ohmic contact with the contact layer provided on the upper DBR 108. A front surface of the upper DBR 108 located on an inner side of the annular p-side electrode 112 serves as a light emission port 112A through which a laser beam is emitted to the outside. That is, light is emitted by the VCSEL in a direction perpendicular to the semiconductor board 100, and thus the axial direction of the mesa M is an optical axis. A cathode electrode 114 is formed as an n-side electrode on a back surface of the semiconductor board 100. The front surface of the upper DBR 108 located on the inner side of the p-side electrode 112 is a light-emitting surface. That is, an optical axis direction of the VCSEL is a light-emitting direction.

An insulating layer 116 is provided in such a manner that a front surface of the mesa M is covered except for a portion where the p-side electrode 112 is connected to an anode electrode (anode electrode 118 to be described later) and the light emission port 112A. The anode electrode 118 is provided to be in ohmic contact with the p-side electrode 112 except for the light emission port 112A. The anode electrode 118 is shared by plural VCSELs. That is, the p-side electrodes 112 of the plural VCSELs forming the light source 10 are connected in parallel by the anode electrode 118. As described above, the anode electrode 118 is provided as a continuous electrode pattern covering a region between each VCSEL except for the light emission port 112A of each VCSEL. Therefore, a pattern having a larger area is formed as compared with a case where drive wiring is individually provided for each VCSEL, and a voltage drop is prevented when a drive current flows.

Here, the VCSEL included in the light source 10 is described as the multi-mode VCSEL having the λ resonator structure. However, the light source 10 may be a single transverse mode VCSEL having a λ resonator structure. The single transverse mode may be referred to as single-mode. Therefore, hereinafter, the single transverse mode is referred to as the single-mode.

Emitted light of the single-mode VCSEL having the $\lambda$ resonator structure has a smaller spread angle as compared with that of the multi-mode VCSEL. The single-mode VCSEL having the $\lambda$ resonator structure has a smaller oxidation aperture diameter as compared with the multi-mode VCSEL, and thus obtained optical output thereof is small. Therefore, a single-mode VCSEL having a long resonator structure may be used as the single-mode VCSEL. In the VCSEL having the long resonator structure, a spacer layer of several $\lambda$ to several tens of $\lambda$ is introduced between an active region in a VCSEL having a general $\lambda$ resonator structure whose resonator length is the oscillation wavelength $\lambda$ and one multi-layer film reflector so as to increase the resonator length and thus increase loss in a high-order transverse mode. Accordingly, single mode oscillation may be performed with an oxidation aperture diameter larger than an oxidation aperture diameter of the VCSEL having the general $\lambda$ resonator structure. In a VCSEL having a typical $\lambda$ resonator structure, since a longitudinal mode interval (may be referred to as a free spectrum range) is large, a stable operation may be obtained by a single longitudinal mode. On the other hand, in the case of the VCSEL having the long resonator structure, a longitudinal mode interval is narrowed since the resonator length is increased, and standing waves, namely plural longitudinal modes, are present in a resonator, and as a result, switching between the longitudinal modes is likely to occur. Therefore, in the VCSEL having the long resonator structure, a layer that prevents the switching between the longitudinal modes is provided. The single-mode VCSEL having the long resonator structure is more likely to have a narrower spread angle as compared with the general single-mode VCSEL having the $\lambda$ resonator structure.

(Light Leaking From Light Source 10)

Figures 7A, 7B, 7C:
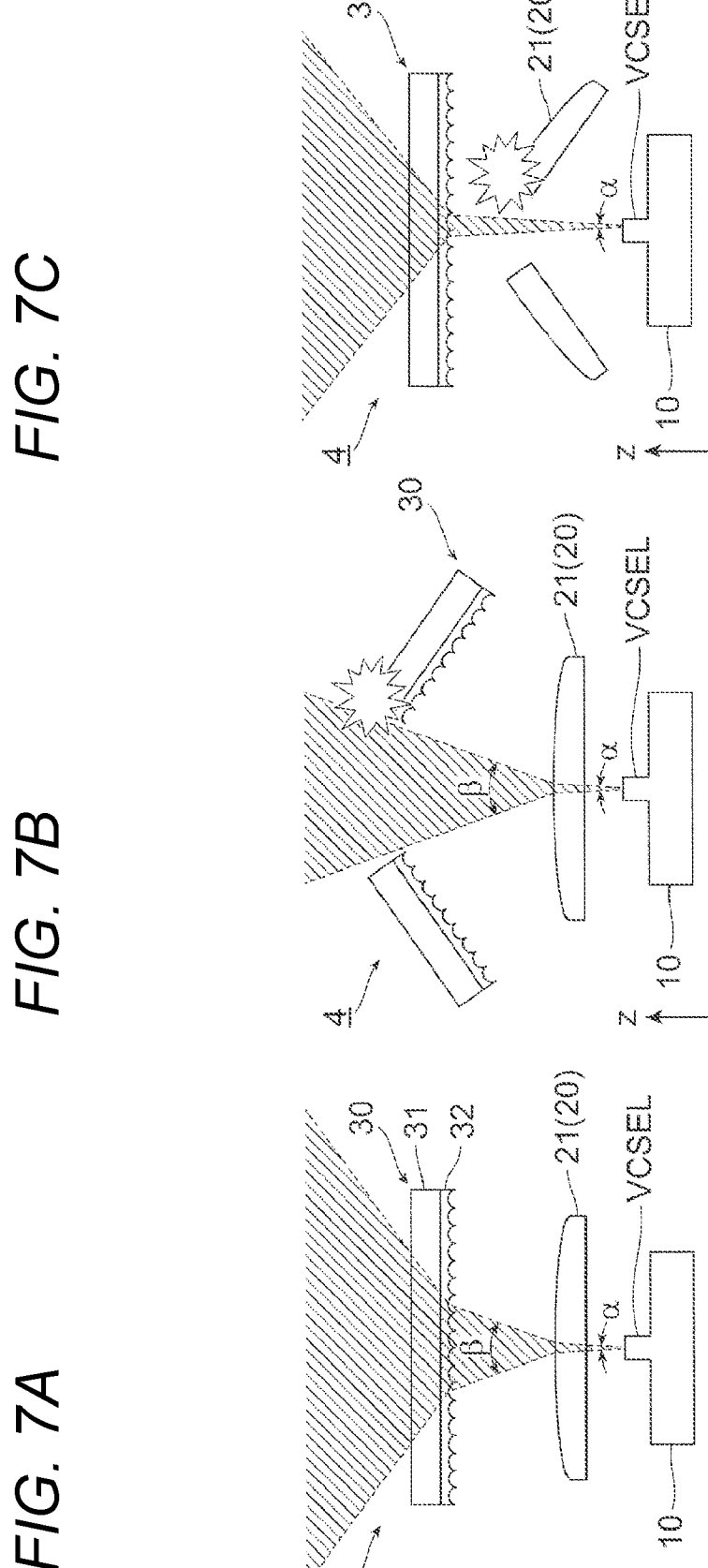
FIGS. 7A to 7C illustrate light leakage in a light-emitting device to which the first exemplary embodiment is applied.

FIGS. 7A to 7C illustrate light leakage in the light-emitting device 4 to which the first exemplary embodiment is applied. FIG. 7A illustrates a state where there is no light leakage, FIG. 7B illustrates a state where light leakage occurs due to breakage of the diffusion plate 30, and FIG. 7C illustrates a state where light leakage occurs due to breakage of the light intensity reduction member 20. Here, a single VCSEL is illustrated and described as the light source 10. The VCSEL emits light at a spread angle $\alpha$. That is, the light emitted from the VCSEL spreads at the spread angle $\alpha$ as a distance in an emission direction increases.

In FIG. 7A, a structure of the diffusion plate 30 will be described. The diffusion plate 30 includes, for example, a flat glass base material 31 whose two surfaces are parallel to each other, and a resin layer 32 in which plural minute concave and convex portions for diffusing light are formed on a front surface on one side of the glass base material 31. The diffusion plate 30 diffuses incident light by the concave and convex portions of the resin layer 32 and emits the diffused light. The resin layer 32 may be provided on the back surface side of the diffusion plate 30 on which light is incident, or may be provided on a front surface side of the diffusion plate 30 from which light is emitted. At this time, at least one of the plural convex portions and the plural concave portions constituting the concave and convex portions of the resin layer 32 has, for example, a width of 10 μm or more and 100 μm or less and a height (depth) of 1 μm or more and 50 μm or less. The concave and convex portions may be a pattern having a period, or may be a random pattern having no period. A refraction direction of the light is controlled by the pattern of the concave and convex portions on the diffusion plate 30, and thus the light emitted from the light source 10 is changed to a desired irradiation pattern. The pattern of the concave and convex portions may be referred to as a lens pattern.

On the diffusion plate 30, by the concave and convex portions formed in the resin layer 32, an irradiation pattern whose one side has a length of about 1 m as illustrated in FIG. 3A is formed from the light emitted from the light source 10 that may substantially be regarded as a point light source whose one side has a length of, for example, 0.5 to 3 mm. Since the resin layer 32 of the diffusion plate 30 allows the light emitted from the VCSEL to pass therethrough, a decrease in light use efficiency caused by absorption is prevented. The pattern of the concave and convex portions is easily manufactured by pressing a previously formed mold or the like against the resin layer.

In the light-emitting device 4 to which the first exemplary embodiment is applied, the light intensity reduction member 20 is a convex lens 21 constituted by a single lens. The convex lens 21 is supported by a support member (not illustrated) in a space between the light source 10 and the diffusion plate 30. When the light-emitting surface of the VCSEL is set between a center and a focal point of the lens, the convex lens 21 spreads and emits light emitted from the VCSEL.

The state where there is no light leakage illustrated in FIG. 7A is a state where the light intensity reduction member 20 and the diffusion plate 30 are normal, and light emitted from each VCSEL of the light source 10 is incident on the convex lens 21 at the spread angle $\alpha$. The light passed through the convex lens 21 is emitted at a spread angle $\beta$ larger than the spread angle $\alpha$ ($\alpha<\beta$). The light emitted at the spread angle $\beta$ is incident on the diffusion plate 30, and is emitted onto the irradiated surface 310 as diffused light (see FIG. 3). That is, the convex lens 21, which is the light intensity reduction member 20, is an optical member that refracts incident light and increases a spread angle of emitted light, and the spread angle is easily increased as compared with a case where the convex lens 21 is not such an optical member.

The spread angle $\beta$ is set such that the light intensity satisfies a predetermined standard when the irradiated surface 310 is directly irradiated with the light emitted from the light intensity reduction member 20. The predetermined standard is, for example, a safety standard related to a laser product such as the international standard "IEC 60825-1" or JIS C 6802 in Japan. For example, the light intensity of the light (beam) emitted from the light intensity reduction member 20 is set to class 1, which is applied to a laser product that is safe even when observation in a direct beam is performed for a long period of time, or even when an observation optical instrument (loupe or binocular) is used at that time. When the irradiated surface 310 is directly irradiated with the light emitted from the VCSEL of the light source 10 at the spread angle $\alpha$, the light intensity does not satisfy the predetermined standard described above, that is, exceeds the predetermined standard described above. As described above, since the diffusion plate 30 diffuses the light from the light source 10, which may be regarded as a point light source, into the irradiation pattern whose one side has the length of about 1 m and emits the irradiation pattern, the light intensity on the irradiated surface 310 is equal to or less than the predetermined standard described above even when the light emitted from the light source 10 (VCSEL) is directly incident on the diffusion plate 30.

Therefore, the light intensity on the irradiated surface 310 when the irradiated surface 310 is irradiated with the light from the light source 10 via the light intensity reduction member 20 and the diffusion plate 30, as illustrated in FIG. 7A, is equal to or less than the predetermined standard described above. That is, there is no leakage of light having light intensity exceeding the predetermined standard.

On the other hand, as illustrated in FIG. 7B, in the state where the diffusion plate 30 is broken, the light emitted from the light source 10 and passed through the light intensity reduction member 20 is irradiated onto the irradiated surface 310 without being diffused by the diffusion plate 30. As described above, the light passed through the light intensity reduction member 20 is set to have the light intensity satisfying the predetermined standard on the irradiated surface 310. Therefore, even when the diffusion plate 30 is broken and the irradiated surface 310 is directly irradiated with light that is not diffused by the diffusion plate 30, the light intensity on the irradiated surface 310 is equal to or less than the predetermined standard described above. That is, even when the diffusion plate 30 is broken, the leakage of light having light intensity exceeding the predetermined standard is prevented.

As illustrated in FIG. 7C, in the state where the light intensity reduction member 20 is broken, the light emitted from the light source 10 is diffused by the diffusion plate 30 and irradiated onto the irradiated surface 310 without passing through the light intensity reduction member 20. As described above, even if the light intensity reduction member 20 is broken, the light intensity on the irradiated surface 310 is equal to or less than the predetermined standard described above. That is, even when the light intensity reduction member 20 is broken, the leakage of light having light intensity exceeding the predetermined standard is prevented.

Although the case where the diffusion plate 30 is broken is illustrated as a state where the diffusion plate 30 is damaged in FIG. 7B, there may also be a case where the diffusion plate 30 is detached or falls off. Similarly, although the case where the light intensity reduction member 20 is broken is illustrated as a state where the light intensity reduction member 20 is damaged in FIG. 7C, there may also be a case where the light intensity reduction member 20 is detached or falls off.

Figures 8A, 8B:
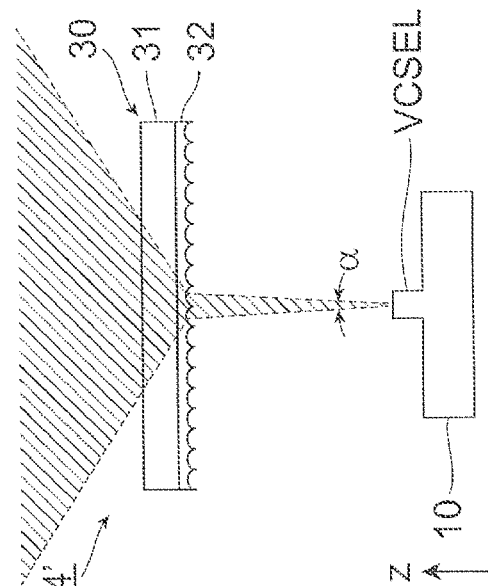
FIGS. 8A and 8B illustrate light leakage in a light-emitting device to which the first exemplary embodiment is not applied.

FIGS. 8A and 8B illustrate light leakage in a light-emitting device 4' to which the first exemplary embodiment is not applied. FIG. 8A illustrates a state where there is no light leakage, and FIG. 8B illustrates a state where light leakage occurs due to breakage of the diffusion plate 30. Hereinafter, portions similar to those of the light-emitting device 4 to which the first exemplary embodiment illustrated in FIGS. 7A, 7B, and 7C is applied will be denoted by the same reference numerals, description thereof will be omitted, and different portions will be described.

The light-emitting device 4' to which the first exemplary embodiment is not applied does not include the light intensity reduction member 20 of the light-emitting device 4 to which the first exemplary embodiment is applied. As illustrated in FIG. 8A, in a state where the diffusion plate 30 is not broken, the light from the light source 10 is irradiated onto the irradiated surface 310 via the diffusion plate 30. Therefore, the light intensity on the irradiated surface 310 is equal to or less than the predetermined standard described above. That is, this state is a state where there is no light leakage.

However, as illustrated in FIG. 8B, when the diffusion plate 30 is broken, the light emitted from the VCSEL of the light source 10 is directly emitted onto the irradiated surface 310. As described above, when the light emitted from the VCSEL is irradiated onto the irradiated surface 310 without passing through the diffusion plate 30, the light intensity on the irradiated surface 310 does not satisfy the predetermined standard described above. That is, leakage of light having light intensity exceeding the predetermined standard occurs.

As described above, in the light-emitting device 4' to which the first exemplary embodiment is not applied, when a failure occurs in which the diffusion plate 30 is broken, the leakage of light having light intensity exceeding the predetermined standard occurs. On the other hand, in the light-emitting device 4 to which the first exemplary embodiment including the light intensity reduction member 20 is applied, even if a failure occurs in which one of the light intensity reduction member 20 and the diffusion plate 30 is broken, the leaking light has light intensity equal to or less than the predetermined standard, and thus the leakage of light having light intensity exceeding the predetermined standard is prevented.

Next, a modification of the light-emitting device 4 will be described. FIGS. 9A to 9D illustrate a modification of the light-emitting device 4. FIG. 9A illustrates a case where the light intensity reduction member 20 is a concave lens 22, FIG. 9B illustrates a case where the convex lens 21 that is the light intensity reduction member 20 is attached to the light source 10, FIG. 9C illustrates a case where the light intensity reduction member 20 is a fly eye lens 23 in which plural convex lenses are arranged, and FIG. 9D illustrates a case where the light intensity reduction member 20 is a fly eye lens 24 in which plural concave lenses are arranged. Here, the light source 10 is described as including the plural VCSELs.

In the case where the light intensity reduction member 20 of FIG. 9A is the concave lens 22 constituted by a single lens, light incident on the concave lens 22 from the VCSEL is emitted with an increased spread angle by the concave lens 22. The concave lens 22 is also an optical member that refracts incident light and increases a spread angle of emitted light. When the light intensity reduction member 20 illustrated in FIG. 7A is the convex lens 21 and when the light intensity reduction member 20 illustrated in FIG. 9A is the concave lens 22, since the convex lens 21 or the concave lens 22 is a single lens, light incident on the convex lens 21 or the concave lens 22 from each VCSEL of the light source 10 has a different spread angle $\beta$, and an emission direction of the light is bent. That is, in the convex lens 21, the emission direction of the light is bent toward a center of the convex lens 21, and in the concave lens 22, the emission direction of the light is bent toward a periphery of the concave lens 22. As described above, the spread angle $\beta$ may be different or the emission direction may be different for each VCSEL.

In FIG. 9B, the convex lens 21 illustrated in FIG. 7A is attached to the light source 10. In FIG. 7A, the convex lens 21 is supported by the support member (not illustrated) in the space between the light source 10 and the diffusion plate 30. In this case, the support member is necessary, and there is a high possibility that the light intensity reduction member 20 (in this case, the convex lens 21) falls off or is broken due to positional deviation or breakage of the support member. However, as illustrated in FIG. 9B, when the convex lens 21 is attached to the light source 10, the support member is not necessary, and the possibility that the light intensity reduction member 20 (in this case, the convex lens 21) falls off or is broken is reduced as compared with the case where the convex lens 21 is supported by the support member.

In FIG. 9C, the light intensity reduction member 20 is the fly eye lens 23 in which the plural convex lenses are arranged, and is attached onto the light source 10. In FIG. 9D, the light intensity reduction member 20 is the fly eye lens 24 in which the plural concave lenses are arranged, and is attached onto the light source 10. The fly eye lenses 23 and 24 are also optical members that refract incident light and increase a spread angle of emitted light. Here, each convex lens of the fly eye lens 23 or each concave lens of the fly eye lens 24 is provided for each VCSEL included in the light source 10. Therefore, when the optical axis of the VCSEL coincides with a central axis of the convex lens of the fly eye lens 23 or a central axis of the concave lens of the fly eye lens 24, a traveling direction of light is not bent. The optical axis of the VCSEL may not coincide with the central axis of the convex lens of the fly eye lens 23 or the central axis of the concave lens of the fly eye lens 24. Although the fly eye lens 23 or the fly eye lens 24 is attached onto the light source 10 in FIGS. 9C and 9D, the fly eye lens 23 or the fly eye lens 24 may be supported by a support member in a gap between the light source 10 and the diffusion plate 30 as in FIG. 7A or 9A. The convex lens of the fly eye lens 23 and the concave lens of the fly eye lens 24 may be provided for each VCSEL of the light source 10, or may be provided for each set of several VCSELs.

Although the convex lenses of the fly eye lens 23 illustrated in FIG. 9C and the concave lens of the fly eye lenses 24 illustrated in FIG. 9D are connected by the same member, the convex lenses of the fly eye lens 23 and the concave lens of the fly eye lenses 24 may be separated. That is, a convex lens or a concave lens may be attached to each VCSEL. When the light source 10 is manufactured, the convex lens or the concave lens may be attached to each VCSEL. In the case where the convex lens or the concave lens is attached to each VCSEL, for example, even if a part of the convex lenses or concave lenses are peeled off, the light intensity on the irradiated surface 310 is unlikely to increase when a ratio of the number of peeled-off lenses to the entire number is small. That is, even if a failure occurs in which a part of convex lenses or concave lenses are peeled off, leaking light has light intensity equal to or less than the predetermined standard, and thus the leakage of light having light intensity exceeding the predetermined standard is prevented. This state is the same as a case where a microlens 25 is provided in a second exemplary embodiment described below.

Second Exemplary Embodiment

In the light-emitting device 4 to which the first exemplary embodiment is applied, the light intensity reduction member 20 is the convex lens 21, the concave lens 22, the fly eye lens 23, or the fly eye lens 24, and is formed separately from the light source 10. In the light-emitting device 4 to which the second exemplary embodiment is applied, the light intensity reduction member 20 is a microlens array 25 formed in a semiconductor manufacturing process for manufacturing the light source 10. Since the other configurations are the same as those of the first exemplary embodiment, description thereof will be omitted.

Figures 10A, 10B:
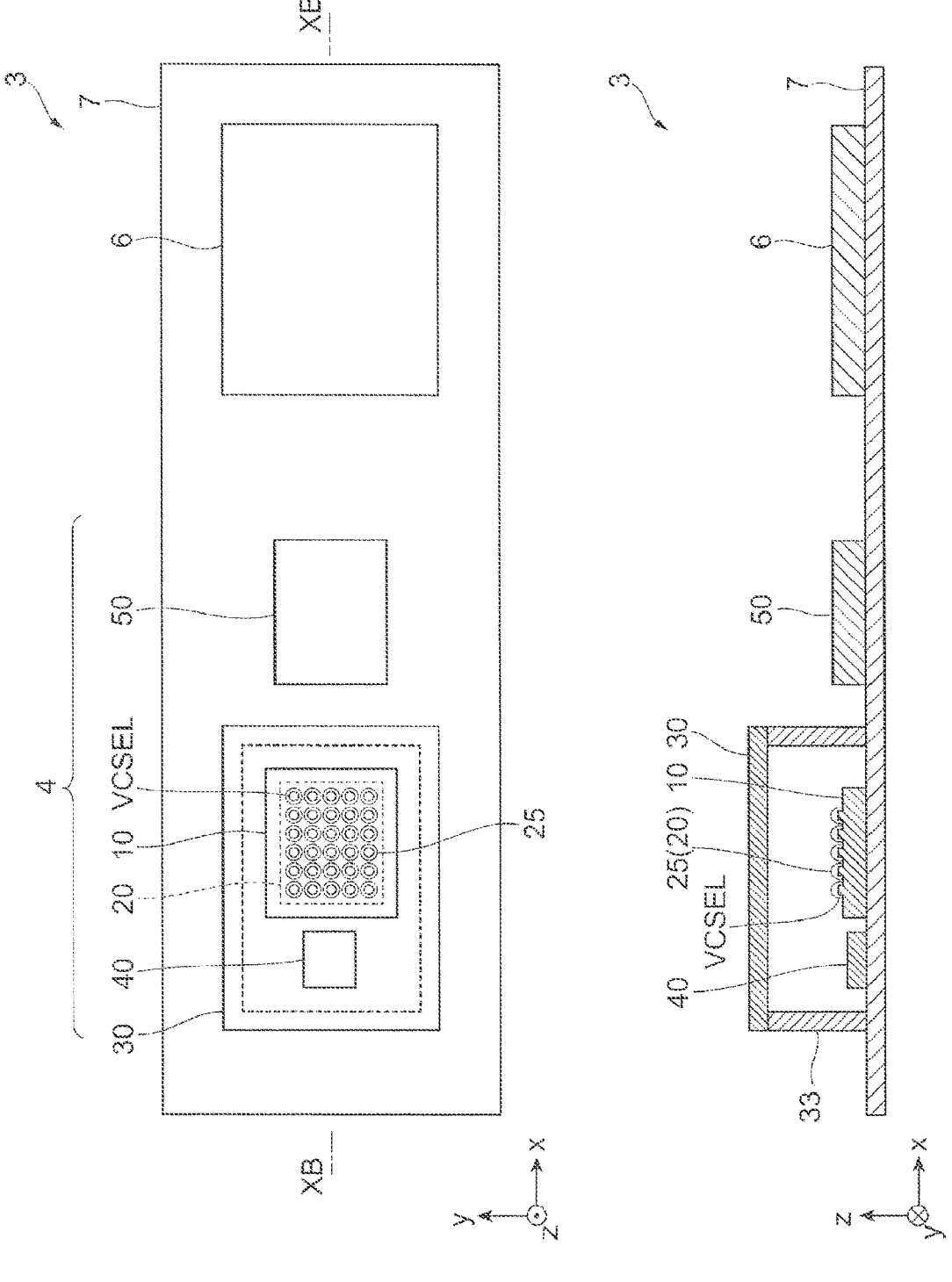
FIGS. 10A and 10B illustrate an example of a plan view and a cross-sectional view of an optical device to which a second exemplary embodiment is applied.

FIGS. 10A and 10B illustrate an example of a plan view and a cross-sectional view of the optical device 3 to which the second exemplary embodiment is applied. FIG. 10A is a plan view, and FIG. 10B is a cross-sectional view taken along line XB-XB of FIG. 10A. In FIG. 10A, a horizontal direction on paper is the x direction, an upper direction on the paper is they direction, and a front side direction perpendicular to a plane of FIG. 10A is the z direction.

As illustrated in FIGS. 10A and 10B, in the optical device 3 to which the second exemplary embodiment is applied, the light intensity reduction member 20 of the light-emitting device 4 is the array of microlenses 25 and is provided on the light source 10. Except for this, a configuration of the optical device 3 to which the second exemplary embodiment is applied is the same as that of the optical device 3 to which the first exemplary embodiment illustrated in FIGS. 5A and 5B is applied. Therefore, the same portions are denoted by the same reference numerals, description thereof will be omitted, and different portions will be described.

As illustrated in FIG. 10B, each microlens 25 in the array of the microlenses 25 serving as the light intensity reduction member 20 is provided for each VCSEL. As illustrated in FIG. 10A, an outer edge of the microlens 25 in a plan view is circular. When the microlens 25 is provided corresponding to each VCSEL, an emission direction of light emitted from the light intensity reduction member 20 may be easily controlled. The optical axis of the VCSEL and a central axis of the microlens 25 may or may not coincide with each other.

The array of the microlenses 25 is formed by, for example, heating a photoresist provided on the VCSEL to cause viscous flow. That is, the microlens 25 is formed in the semiconductor manufacturing process for manufacturing the light source 10. When the microlens 25 is formed by the viscous flow, the microlens 25 becomes a concave lens. In this case, in order to increase a spread angle of light, the light-emitting surface of the VCSEL may be set between a center and a focal point of the microlens 25. That is, the microlens 25 is an optical member that refracts incident light and increases a spread angle of emitted light. The microlenses 25 may be connected to each other by a material forming the microlenses 25.

In the case where the light intensity reduction member 20 described in the first exemplary embodiment is the fly eye lenses 23 and 24, the light source 10 and the fly eye lenses 23 and 24 are configured as separate members. Therefore, when the light-emitting device 4 is assembled, a positional relationship between the convex lens of the fly-eye lens 23 or the concave lens of the fly-eye lens 24 and the VCSEL included in the light source 10 is mechanically aligned to perform attachment. In the case of such mechanical alignment, it is difficult to ensure accuracy, and the fly eye lenses 23 and 24 may be displaced or detached from the light source 10.

On the other hand, when the light intensity reduction member 20 is the array of the microlenses 25, the array of the microlenses 25 is formed following the semiconductor manufacturing process for manufacturing the VCSEL, and thus a positional relationship between the VCSEL and the microlenses 25 may be more accurately set as compared with the case where the light intensity reduction member 20 is the fly eye lenses 23 and 24. The array of the microlenses 25 is unlikely to be detached or displaced from the light source 10. By forming the array of the microlenses 25 as the light intensity reduction member 20 on the light source 10, a size of the light-emitting device 4 is reduced.

Figures 11A, 11B:
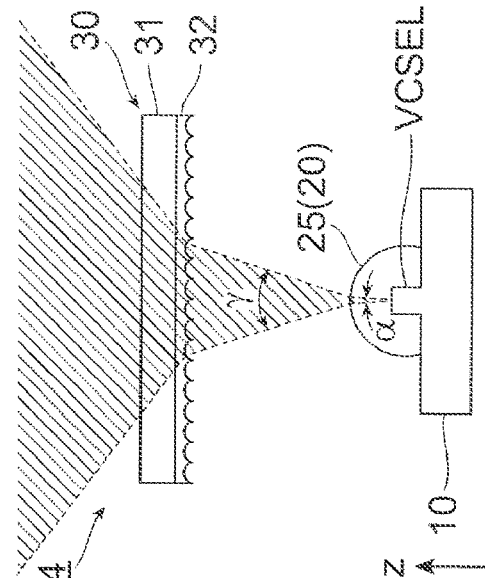
FIGS. 11A and 11B illustrate light leakage in a light-emitting device 4 to which the second exemplary embodiment is applied.

FIGS. 11A and 11B illustrate light leakage in the light-emitting device 4 to which the second exemplary embodiment is applied. FIG. 11A illustrates a state where there is no light leakage, and FIG. 11B illustrates a state where light leakage occurs due to breakage of the diffusion plate 30. Here, one VCSEL included in the light source 10 is illustrated and described. It is assumed that the VCSEL emits light at the spread angle α.

As illustrated in FIG. 11A, it is assumed that the light emitted from the VCSEL is emitted by the microlens 25 at a spread angle γ larger than the spread angle α (α<γ). The light emitted at the spread angle γ is incident on the diffusion plate 30, and is irradiated onto the irradiated surface 310 as diffused light (see FIG. 3). When the irradiated surface 310 is directly irradiated with the light emitted from the microlens 25, the light intensity on the irradiated surface 310 is set to satisfy the predetermined standard described above.

In the case of FIG. 11A, the light intensity of the light emitted from the light source 10 to the irradiated surface 310 via the light intensity reduction member 20 (the array of the microlenses 25) and the diffusion plate 30 is equal to or less than the predetermined standard described above. That is, there is no leakage of light having light intensity exceeding the predetermined standard.

As illustrated in FIG. 11B, in the state where the diffusion plate 30 is broken, the light passed through the light intensity reduction member 20 is irradiated onto the irradiated surface 310 without being diffused by the diffusion plate 30. As described above, the light emitted from the microlens 25 is set to have the light intensity satisfying the predetermined standard on the irradiated surface 310. Therefore, even when the diffusion plate 30 is broken and the irradiated surface 310 is directly irradiated with light that is not diffused by the diffusion plate 30, the light intensity on the irradiated surface 310 is equal to or less than the predetermined standard described above. That is, even when the diffusion plate 30 is broken, the leakage of light having light intensity exceeding the predetermined standard is prevented.

As described in the case of the light-emitting device 4' to which the first exemplary embodiment is not applied, when the light intensity reduction member 20 is not provided, when a failure occurs in which the diffusion plate 30 is broken, the leakage of light having light intensity exceeding the predetermined standard occurs. On the other hand, in the case of the light-emitting device 4 to which the second exemplary embodiment including the array of the microlenses 25 as the light intensity reduction member 20 is applied, even if a failure occurs in which the diffusion plate 30 is damaged, the leaking light has light intensity equal to or less than the predetermined standard, and thus the leakage of light having light intensity exceeding the predetermined standard is prevented.

In the first exemplary embodiment, the convex lens 21, the concave lens 22, or the fly eye lenses 23 and 24 are used as the light intensity reduction member 20, while in the second exemplary embodiment, the array of the microlenses 25 is used as the light intensity reduction member 20. However, the light intensity reduction member 20 is not necessarily a lens, and may be any member that reduces the light intensity.

As described above, by providing the light intensity reduction member 20 in addition to the diffusion plate 30 and setting the light intensity of the light leaking from the light-emitting device to be equal to or less than the predetermined standard at the time of failure, it may be possible to expand the measurement target of the three-dimensional shape to the face or the like. By driving the information processing device 1 with a battery, the three-dimensional shape may be easily measured by the portable information processing terminal.

Although an example in which the plural VCSELs are connected in parallel is described in the first exemplary embodiment and the second exemplary embodiment described above, a configuration in which plural VCSELs are connected in series or a connection configuration in which series connection and parallel connection are combined may be used.

Although an example in which the plural VCSELs are configured in a mesa shape is described in the first exemplary embodiment and the second exemplary embodiment described above, the plural VCSELs may be configured in a form other than the mesa shape. For example, plural holes may be provided to surround the emission port of each VCSEL, and the current confinement layer 110 may be oxidized using the holes so as to form a VCSEL having an oxidized confinement structure.

Although the plural VCSELs emit light from the surface side (front surface side) on which the epitaxial layer is formed on the board 100 in the first exemplary embodiment and the second exemplary embodiment described above, light may be emitted from a surface side (back surface side) on which the epitaxial layer is not formed.

Although the light source 10 and the diffusion plate 30 are disposed at positions overlapping each other when viewed from the light emission surface side in the first exemplary embodiment and the second exemplary embodiment described above, the light source 10 and the diffusion plate 30 may be disposed at positions not overlapping each other. For example, a configuration in which light may be diffused via a reflection member such as a reflection mirror even though the diffusion plate 30 and the light source 10 are disposed at positions not overlapping each other may be adopted.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting device comprising:
a light source comprising a plurality of light-emitting elements,
   wherein each of the plurality of light-emitting elements comprises a vertical-cavity surface-emitting laser, and
   wherein the light source is configured to emit light having a light intensity exceeding a predetermined standard;
a lens that is provided in a light-emitting path of the light source,
   wherein the lens is configured to reduce intensity of light emitted from the light source and emit the light, and
   wherein the lens is configured such that intensity of the light exiting the lens satisfies the predetermined standard; and
a diffusion plate that is provided on a light-emitting side of the lens,
   wherein the diffusion plate is configured to diffuse and irradiate light incident from the lens, and
   wherein the diffusion plate is configured such that intensity of the light exiting the diffusion plate satisfies the predetermined standard even in a case where the lens is not provided.

2. The light-emitting device according to claim 1, wherein the lens is an optical member configured to refract incident light to increase a spread angle of emitted light.

3. The light-emitting device according to claim 2, wherein the lens is provided on the light-emitting elements of the light source.

4. The light-emitting device according to claim 3, wherein the lens is a microlens provided for each of the light-emitting elements of the light source.

5. The light-emitting device according to claim 1, wherein the plurality of light-emitting elements are connected in parallel to each other by an electrode pattern, and the electrode pattern covers a region excluding an emission port of each of the light-emitting elements in a continuous pattern.

6. The light-emitting device according to claim 1, wherein the diffusion plate is configured to change directivity of the light emitted from the lens and emit the light.

7. The light-emitting device according to claim 6, wherein the diffusion plate is a plate-like member having a structure configured to change the directivity of light on at least one surface of the plate-like member.

8. The light-emitting device according to claim 1, wherein the diffusion plate is a plate-like member having a plurality of convex portions and concave portions on at least one surface of the plate-like member.

9. The light-emitting device according to claim 1, wherein the diffusion plate is configured to emit light used for measuring a three-dimensional shape by a time-of-flight method.

10. The light-emitting device according to claim 1, wherein the light source, the lens, and the diffusion plate are mounted on a portable information processing terminal, and the light source is driven by a battery.

11. An optical device comprising:

the light-emitting device according to claim 1; and a light sensor configured to receive light that is emitted from a light source of the light-emitting device and reflected by a measurement target, and output a signal corresponding to a time from when the light is emitted from the light source to when the light is received by the light sensor.

12. An information processing device comprising:

the optical device according to claim 11; and at least one processor configured to identify a three-dimensional shape of a measurement target based on light that is emitted from the light source of the light-emitting device of the optical device, reflected by the measurement target, and received by the light sensor of the optical device.

13. The information processing device according to claim 12, wherein the at least one processor is further configured to perform an authentication process related to use of the information processing device based on a result of identification performed by the at least one processor.

* * * * *